(12) United States Patent
Bae et al.

(10) Patent No.: US 12,061,500 B2
(45) Date of Patent: Aug. 13, 2024

(54) COMMUNICATION SYSTEM INCLUDING ANTENNAS ON SUBSTRATE

(71) Applicant: Whoborn, Inc., Seoul (KR)

(72) Inventors: Youngsik Bae, Seoul (KR); WonSuk Do, Seoul (KR)

(73) Assignee: Whoborn, Inc., Seoul (KR)

( * ) Notice: Subject to any disclaimer, the term of this patent is extended or adjusted under 35 U.S.C. 154(b) by 431 days.

(21) Appl. No.: 17/346,749

(22) Filed: Jun. 14, 2021

(65) Prior Publication Data

US 2021/0307175 A1 Sep. 30, 2021

Related U.S. Application Data

(63) Continuation-in-part of application No. 16/936,884, filed on Jul. 23, 2020, now Pat. No. 11,039,538, which is a continuation of application No. 16/204,255, filed on Nov. 29, 2018, now Pat. No. 10,765,007.

(30) Foreign Application Priority Data

Nov. 29, 2017 (KR) .................. 10-2017-0161134

(51) Int. Cl.
| | | |
|---|---|---|
| *G06F 1/16* | (2006.01) | |
| *G06F 1/26* | (2006.01) | |
| *H01Q 1/24* | (2006.01) | |
| *H05K 1/03* | (2006.01) | |
| *H05K 1/18* | (2006.01) | |

(52) U.S. Cl.
CPC ............ *G06F 1/1698* (2013.01); *G06F 1/266* (2013.01); *H01Q 1/243* (2013.01); *H05K 1/0393* (2013.01); *H05K 1/189* (2013.01); *H05K 2201/09409* (2013.01); *H05K 2201/10098* (2013.01)

(58) Field of Classification Search
CPC ...... H01Q 1/2216; H01Q 21/06; H01Q 1/243; G01S 5/14; G01S 13/74; G01S 5/02; G01S 13/878; H05K 1/189; H05K 1/0393; H05K 2201/09409; H05K 2201/10098; H05K 1/165; G06F 1/1698; G06F 1/266
See application file for complete search history.

(56) References Cited

U.S. PATENT DOCUMENTS

| | | | | |
|---|---|---|---|---|
| 5,956,638 A | * | 9/1999 | Chang ................... | H04W 52/24 |
| | | | | 455/423 |
| 2005/0211692 A1 | * | 9/2005 | Maitani .............. | G03G 15/5004 |
| | | | | 219/216 |
| 2007/0139145 A1 | * | 6/2007 | Subramanian ..... | H01H 59/0009 |
| | | | | 335/78 |
| 2008/0140575 A1 | * | 6/2008 | Cannady .............. | G06Q 20/403 |
| | | | | 705/67 |

(Continued)

FOREIGN PATENT DOCUMENTS

AU   2016403974 A1 * 11/2018 ............. G06Q 20/12

*Primary Examiner* — Santosh R Poudel
(74) *Attorney, Agent, or Firm* — United One Law Group LLC; Kongsik Kim; Jhongwoo Peck

(57) ABSTRACT

A communication system includes a substrate, a plurality of antennas disposed on the substrate, and a radio frequency (RF) tag. A distance between the RF tag and at least one antenna among the plurality of antennas is detected based on a signal emitted by the RF tag and received by the at least one antenna.

13 Claims, 10 Drawing Sheets

(56) References Cited

U.S. PATENT DOCUMENTS

| | | | |
|---|---|---|---|
| 2010/0085214 A1* | 4/2010 | Kim | G08G 1/14 |
| | | | 455/414.1 |
| 2012/0156987 A1* | 6/2012 | Nakayama | H04W 56/00 |
| | | | 455/13.2 |
| 2015/0309156 A1* | 10/2015 | Chua | G08G 1/145 |
| | | | 342/451 |
| 2016/0307013 A1* | 10/2016 | Dagdelen | G06Q 10/0833 |
| 2017/0031432 A1* | 2/2017 | Hill | G06F 3/017 |
| 2017/0124364 A1* | 5/2017 | Villar | G06K 7/10138 |

* cited by examiner

COMMUNICATION SYSTEM INCLUDING ANTENNAS ON SUBSTRATE

CROSS-REFERENCE TO RELATED APPLICATIONS

This application is a Continuation in part of application Ser. No. 16/936,884 filed on Jul. 23, 2020, issued as U.S. Pat. No. 11,039,538, which is a Continuation of application Ser. No. 16/204,255 filed on Nov. 29, 2018, issued as U.S. Pat. No. 10,765,007, which claims priority to Korean Patent Application No. 10-2017-0161134 filed on Nov. 29, 2017. The aforementioned applications are incorporated herein by reference in their entireties.

TECHNICAL FIELD

The present invention relates to a communication device based on a board for wireless communication with an RF tag, and more particularly, to a communication device based on a board including a plurality of antennas communicating with an RF tag to precisely estimate the location of the RF tag. Further, the present invention relates to a safety device for a flexible circuit board, which is characterized by measuring a damage portion of a specific area of the flexible circuit board through measurement on whether it is normal with a measurement or verification sensor for an amount of current supplied to each.

RELATED ART

RF is an abbreviation of Radio Frequency and is a communication method for exchanging information by radiating radio frequency. As a technology to replace the barcode that has been widely used in the past, short range wireless communication is attracting attention. Since short range wireless communications may process more information than barcodes and may transmit and receive information without touching or scanning directly, recently, its application range is expanding.

The short range wireless communication is used to attach a short range wireless communication tag to target objects, and a reader reads the tag to transmit/receive information.

The tag includes a tag chip for storing information and processing signals and an antenna unit for transmitting and receiving signals. The antenna unit has an RF characteristic capable of transmitting and receiving a frequency corresponding to a signal transmitted and received by the reader.

A flexible circuit board refers to an electronic circuit including a flexible material that may be easily bent and folded.

SUMMARY

The present disclosure provides a communication device based on a board or a substrate including a plurality of antennas communicating with an RF tag to precisely calculate the location of the tag.

The present disclosure also provides variously activating a plurality of antennas included in a communication device to calculate the location of the RF tag while minimizing power consumption.

The present disclosure also provides recognizing the bending of a flexible circuit board in a communication device.

An embodiment of the inventive concept provides a communication device communicating wirelessly. The communication device includes: a control unit configured to collectively control the communication device; a power supply unit configured to supply power to a configuration included in the communication device based on a control of the control unit; a substrate; and a plurality of antennas disposed on the substrate.

In an embodiment, the power supply unit may adjust an amount of current supplied to each of a plurality of antennas so that a detection range of one antenna does not overlap a detection range of another antenna.

In an embodiment, the power supply unit may adjust an amount of current supplied to each of the plurality of antennas so that a detection range of one antenna may overlap a detection range of another antenna closest to the one antenna.

In an embodiment, the power supply unit may adjust an amount of current supplied to each of the plurality of antennas so that a detection range of one antenna may overlap a detection range of another antenna that is the second closest to the one antenna.

In an embodiment, the control unit may calculate a location of an RF tag based on an antenna for wirelessly communicating with the RF tag, and a signal strength of a signal received by the antenna from the RF tag.

In an embodiment, the plurality of antennas may be arranged in a plurality of rows and columns, wherein the power supply unit may sequentially apply power to a plurality of antennas in ascending order of the rows, and apply power to a plurality of antennas located in the same row in ascending order of the columns.

In an embodiment, the plurality of antennas may be arranged in a plurality of rows and columns, wherein the power supply unit may supply power to only one antenna of two antennas disposed closest to each other.

In an embodiment, an RF tag may be disposed on the flexible circuit board, wherein the control unit may determine whether the flexible circuit board is bent based on a received signal strength received by the plurality of antennas from the RF tag.

In an embodiment of the inventive concept, a safety device based on a flexible circuit board includes: a control unit configured to collectively control the safety device based on the flexible circuit board; a power supply unit configured to supply power to a configuration included in the safety device based on the flexible circuit board based on a control of the control unit; and a flexible circuit board, wherein a damage portion of a specific area of the flexible circuit board is measured through measurement on whether it is normal with a measurement or verification sensor for an amount of current supplied to each.

In an embodiment of the inventive concept, provided is a device with a built-in protection circuit to recognize bending in a flexible circuit board and to prevent fire and malfunction, wherein the device with the built-in protection circuit includes the device above.

In an embodiment of the inventive concept, provided is a storage medium for storing software to recognize bending in a flexible circuit board and to prevent fire and malfunction, which is implemented in the device above.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
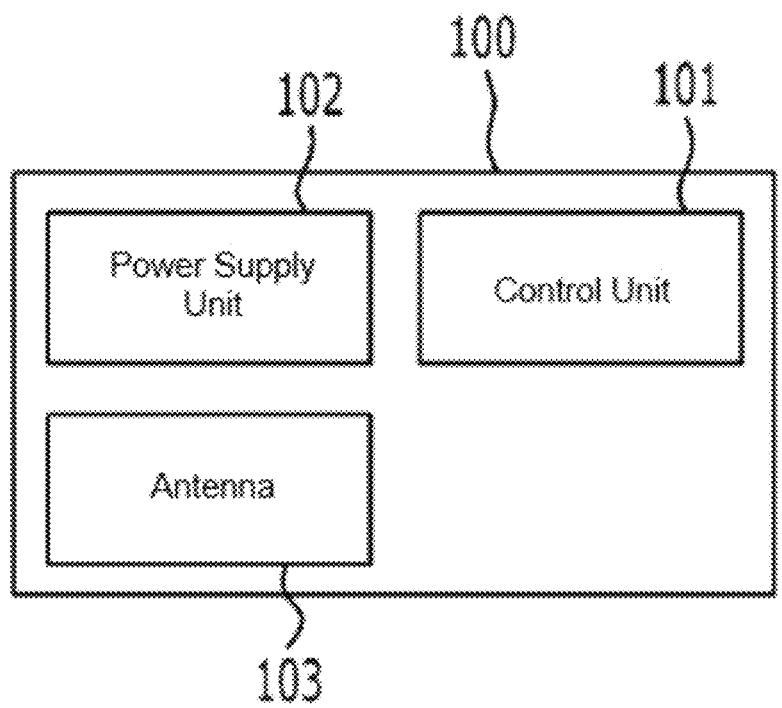
FIG. 1 shows the overall configuration of a communication device according to an embodiment.

The foregoing and further aspects are embodied through the embodiments described with reference to the accompanying drawings. It will be understood that the components of each embodiment are possible in various combinations within the embodiments as long as there is no other comment or mutual contradiction. Furthermore, the present invention may, however, be embodied in different forms and should not be constructed as limited to the embodiments set forth herein.

Parts not relating to description are omitted in the drawings in order to clearly describe the present invention and like reference numerals refer to like elements throughout. Furthermore, when it is described that one comprises (or includes or has) some elements, it should be understood that it may comprise (or include or has) only those elements, or it may comprise (or include or have) other elements as well as those elements if there is no specific limitation.

In addition, throughout the specification, when a portion is referred to as being "connected" to another portion, it includes not only "directly connected" but also "electrically connected" with another element therebetween. Further, in the specification, a signal means an amount of electricity such as a voltage or a current.

As used herein, a "unit" refers to a "block for configuring a system of hardware or software to be changed or pluggable", and that is, is a unit or block that performs a specific function in hardware or software.

Figure 2:
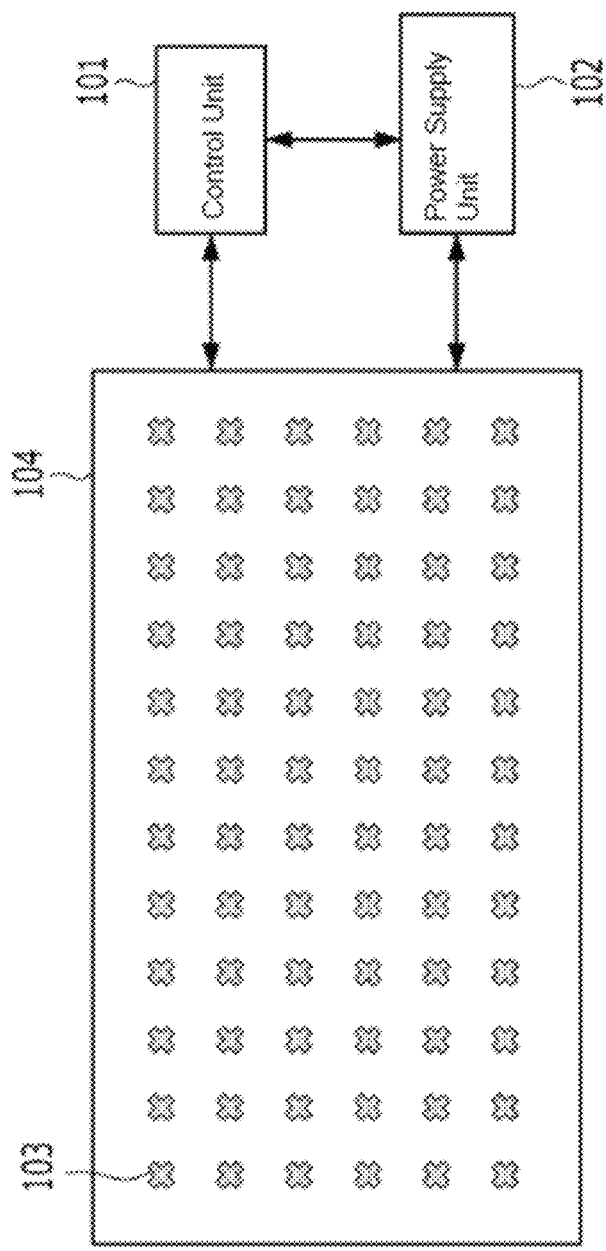
FIG. 2 shows a plurality of antennas disposed on a control unit, a power supply unit, and a flexible circuit board according to an embodiment.

FIG. 1 shows the overall configuration of a communication device 100 based on a flexible circuit board according to an embodiment. FIG. 2 shows a plurality of antennas 103 disposed on a control unit 101, a power supply unit 102, and a flexible circuit board 104 according to an embodiment.

A communication device based on a flexible circuit board wirelessly communicating with an RF tag 106 includes a control unit 101 for controlling the communication device based on the flexible circuit board overall; a power supply unit 102 for supplying power to the components in the communication device based on the flexible circuit board based on the control of the control unit 101; a flexible circuit board 104; and a plurality of antennas 103 disposed on the flexible circuit board 104. The power supply unit 102 adjusts the detection range of each of the plurality of antennas 103 by adjusting the amount of current supplied to each of the plurality of antennas 103, and the detection range is within a maximum distance within which the antenna 103 receives a signal from the RF tag 106.

The wireless communication includes a technique for identifying an object using a radio frequency (RF), and refers to a system that uses 'non-contact or radio frequency recognition technology' that automatically recognizes, by a reader, data stored in a tag, label, card, etc. with a built-in microchip through radio frequency. The wireless communication may include radio frequency identification (RFID), near-field communication (NFC), and the like.

An RFID system includes an RF reader that performs a reading and decoding function and a RFID tag that stores information and exchanges data using a protocol. The tag 106 includes a semiconductor transponder chip and an antenna, and the antenna of the tag 106 receives a radio signal generated and propagated in the antenna 103 of a reader configured in an RF field. The chip of the tag 106 receives energy and transmits pre-programmed data, and such transmission of data is performed by modulating a part of the radio signal received at the antenna of the tag 106 and echoing it to the reader.

NFC-based tags and readers operate in active or passive communication mode. In the active communication mode, each of the tag and the reader includes a power supply. That is, either the tag or the reader may be a receiver for receiving data. In the passive communication mode, the tag receives power by the electromagnetic field provided by the reader and operates.

The antenna of the tag 106 may be categorized into an antenna for a passive tag 106 using an inductive current or a self-powered antenna for an active tag 106.

The antenna of the tag 106 is printed on a thin film material or a printed circuit board material to be made small, and is used to communicate with the reader to transmit data and recognize the other party. In general, the antenna of the tag 106 has a characteristic in which the beam pattern is oriented in the vertical direction of the thin film or the material surface of the printed circuit board.

The control unit 101 controls the communication device based on the flexible circuit board overall. The control unit 101 is a microcontroller or a microprocessor. That is, the control unit 101 may be implemented by a microprocessor or a microcontroller executing a program stored in a memory. The control unit 101 may cause an antenna 103 to generate an RF signal and radiate the RF signal therethrough, which will be described later.

The power supply unit 102 supplies power to the components of the communication device based on the flexible circuit board, based on the control of the control unit 101.

The flexible printed circuit board 104 is a circuit board with a copper foil on a thin insulation film having a thickness of about 10 μm, and unlike rigid hard substrates, is thin and flexible. Although the flexible circuit board 104 is not shown in FIG. 1, the flexible circuit board 104 is a component of the communication device 100 based on the flexible circuit board.

A plurality of antennas 103 are disposed on the flexible circuit board 104. The plurality of antennas 103 may communicate with each RF tag 106. The plurality of antennas 103 may be arranged in a lattice pattern, as shown in FIG.

2. The shape in which the plurality of antennas 103 are disposed is not limited to the lattice pattern.

The power supply unit 102 adjusts the detection range of each of the plurality of antennas 103 by adjusting the amount of current supplied to each of the plurality of antennas 103, and the detection range is a range in which the antenna 103 receives a signal from the RF tag 106.

When the amount of current supplied by the power supply unit 102 to the antenna 103 increases, the detection range of the antenna 103 is increased.

Figure 3:
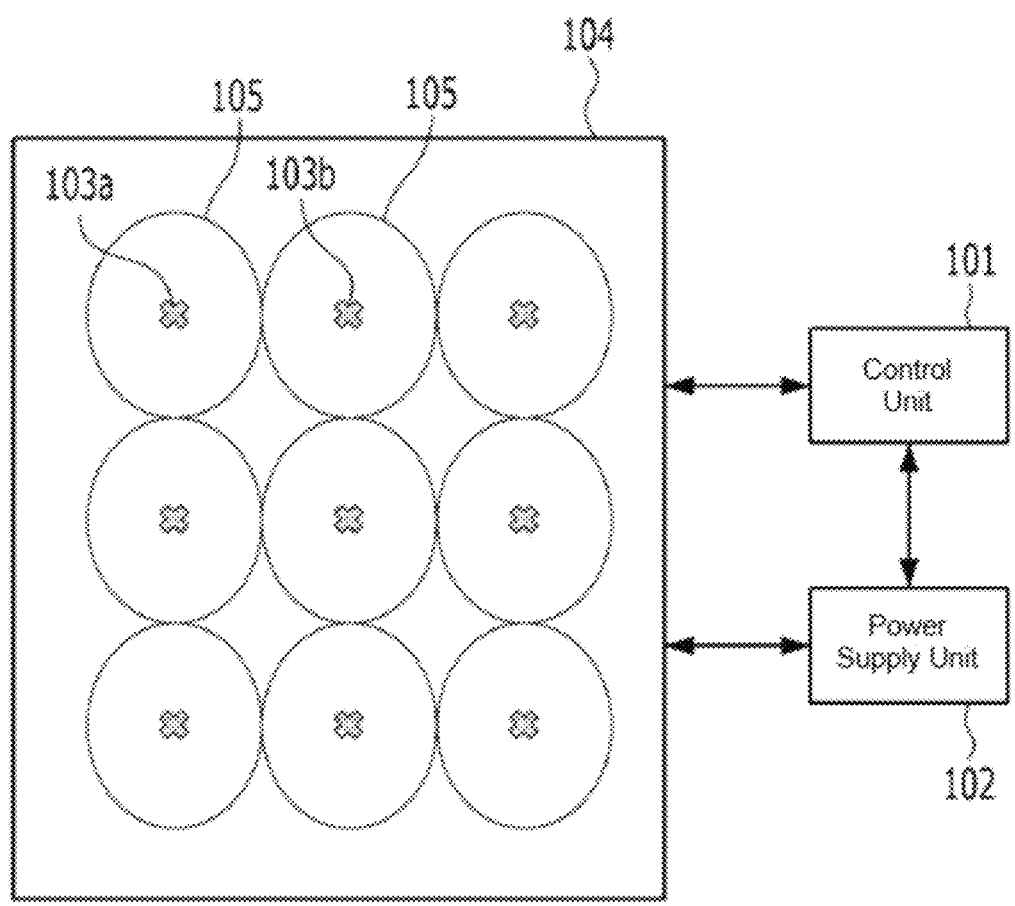
FIG. 3 shows a plurality of antennas disposed on a control unit, a power supply unit, and a flexible circuit board according to an embodiment.

FIG. 3 shows a plurality of antennas 103 disposed on a control unit 101, a power supply unit 102 and a flexible circuit board 104 according to an embodiment. The antenna according to FIG. 3 detects the tag at a short distance. The nearest antennas are located remotely from each other and do not overlap the detection range. Accordingly, the antennas according to FIG. 3 may perform multiple parallel reading without crosstalk with each other, and the data collected for location confirmation checks the transmission/reception signal level and has the feature of the reading point location information.

It is shown that in the embodiment according to FIGS. 3-6, only the antenna 103 is arranged on the flexible circuit board 104. FIG. 2 shows a plurality of antennas 103 disposed on a control unit 101, a power supply unit 102 and a flexible circuit board 104 according to an embodiment.

The power supply unit 102 adjusts the amount of current supplied to each of the plurality of antennas 103, so that the detection range of one of the antennas 103 does not overlap the detection range of the other one of the antennas 103. Referring to FIG. 3, it may be noted that the detection ranges of the two closest antennas 103*a* and 103*b* do not overlap with each other. If the detection range overlaps, the power supply unit 102 reduces the amount of current supplied to the antenna 103 to decrease the detection range. If the distance between the boundary lines of the detection ranges is greater than the reference value, the power supply unit 102 increases the amount of current supplied to the antenna 103 to increase the detection range.

Figure 4:
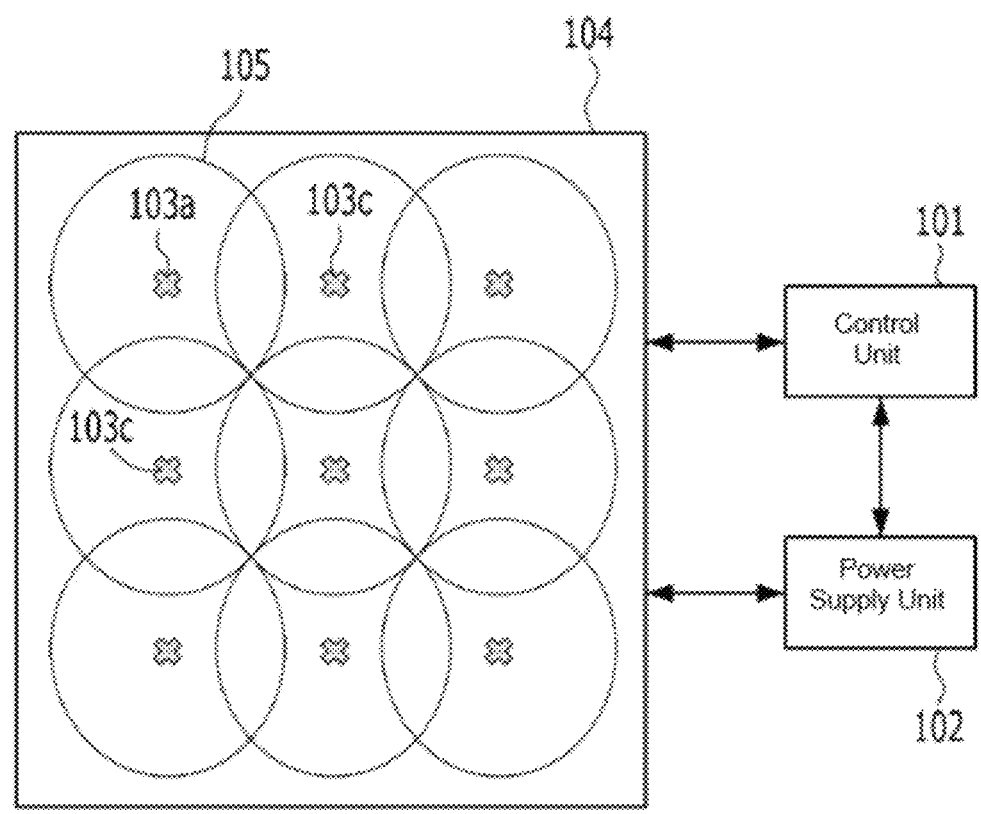
FIG. 4 shows a plurality of antennas disposed on a control unit, a power supply unit, and a flexible circuit board according to an embodiment.

FIG. 4 shows a plurality of antennas 103 disposed on a control unit 101, a power supply unit 102 and a flexible circuit board 104 according to an embodiment. The antenna according to FIG. 3 detects the tag at a medium distance. The nearest antennas are arranged at a medium distance from each other, so that the detection range is partially overlapped.

The power supply unit 102 adjusts the amount of current supplied to each of the plurality of antennas 103, so that the detection range of any one of the antennas 103 overlaps the detection range of the other antenna 103 closest to the one of the antennas 103. In the embodiment according to FIG. 3, if the power supply unit 102 supplies more current to the antenna 103 than the current supplied to the antenna 103, the detection range for each antenna 103 may be increased. Referring to FIG. 4, it may be noted that the detection range of one antenna 103*a* overlaps the detection range of the two antennas 103*b* and 103*c* closest to the antenna 103*a*.

Figure 5:
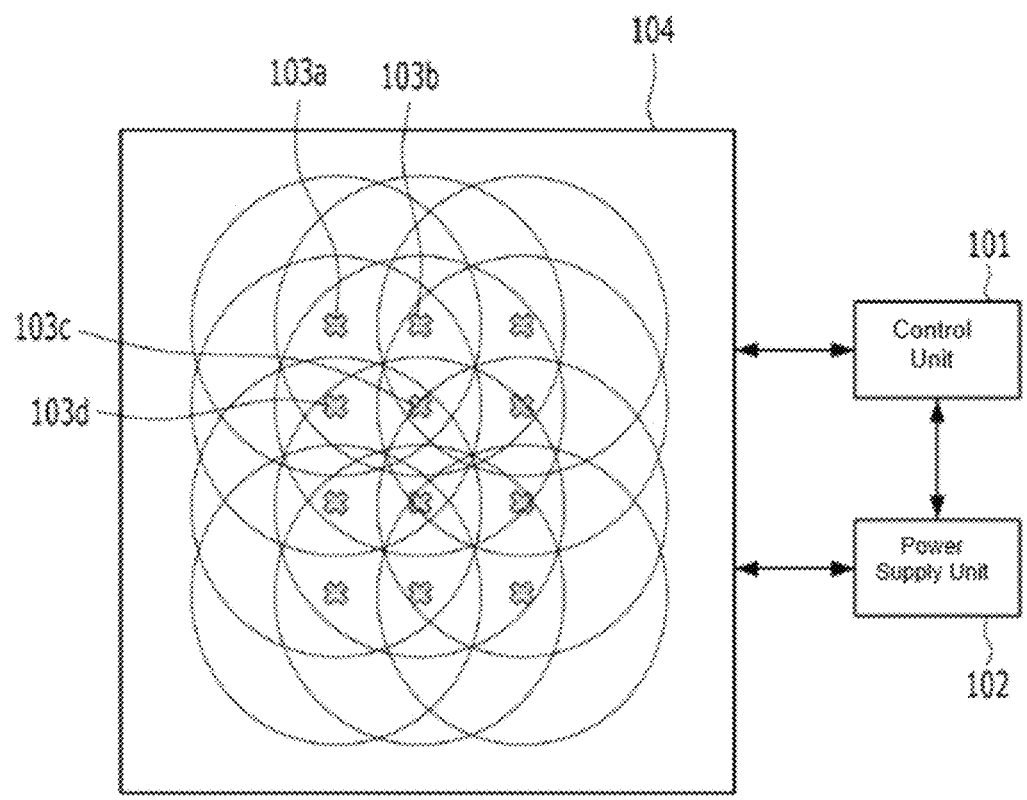
FIG. 5 shows a plurality of antennas disposed on a control unit, a power supply unit, and a flexible circuit board according to an embodiment.

FIG. 5 shows a plurality of antennas 103 disposed on a control unit 101, a power supply unit 102 and a flexible circuit board 104 according to an embodiment. The antenna according to FIG. 5 detects the tag at a long distance. Two adjacent antennas are arranged close to each other. The detection ranges of the plurality of antennas are overlapped, so that in a sequential search, it is possible to perform a double or triple search and a distribution diagram is generated. Collection data for location confirmation checks the transmission/reception signal level, checks the reading point location information, generates a reception distribution diagram, and check a crosstalk material.

The power supply unit 102 adjusts the amount of current supplied to each of the plurality of antennas 103, so that the detection range of any one of the antennas 103 overlaps the detection range of the other antenna 103 that is the second closest to the one of the antennas 103. In the embodiment according to FIG. 4, if the power supply unit 102 supplies more current to the antenna 103 than the current supplied to the antenna 103, the detection range for each antenna 103 may be increased. In the embodiment according to FIG. 5, it may be noted that the detection range of one antenna 103*a* overlaps the detection range of the two antennas 103*b* and 103*c* closest to the antenna 103*a*. Furthermore, it may be noted that the detection range of one antenna 103*a* overlaps the detection range of the two antennas 103*d* that are the second closest to the antenna 103*a*.

Figure 6:
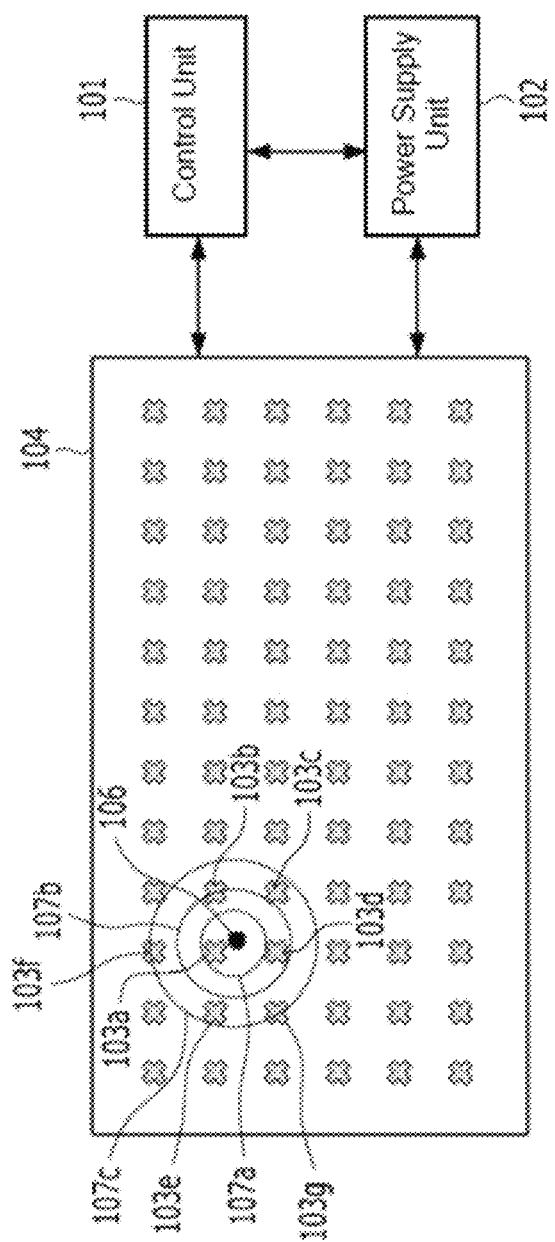
FIG. 6 shows a plurality of antennas disposed on a control unit, a power supply unit, and a flexible circuit board according to an embodiment.

FIG. 6 shows a plurality of antennas 103 disposed on a control unit 101, a power supply unit 102 and a flexible circuit board 104 according to an embodiment.

The control unit 101 calculates the location of the RF tag based on the antenna 103 for wirelessly communicating with the RF tag 106, and the signal strength of the signal received by the antenna 103 from the RF tag 106.

FIG. 6 shows the RF tag 106 disposed on the flexible circuit board 104. The signal transmission range of the tag 106 is related to the power supplied by the antenna 103. When the antenna 103 emits a strong signal as the supplied power increases, the RF tag 106 transmits a signal to the peripheral antenna 103 based on the signal. FIG. 6 shows the signal transmission range of the RF tag 106. If the transmission range 107*a* is narrow, only one antenna 103*a* receives a signal from the RF tag 106. The control unit 101 determines that there is an RF tag 106 around the antenna 103*a*.

If a transmission range 107*b* is above the reference value, three or more antennas 103*a*, 103*b*, 103*c*, and 103*d* receive signals from the RF tag 106. The control unit 101 calculates the location of the RF tag 106 based on the triangulation method using the received signal strength of the antennas 103*a*, 103*b*, 103*c*, and 103*d*.

If a transmission range 107*c* is above the reference value, three or more antennas 103*a*, 103*b*, 103*c*. 103*d*, 103*e*, and 103*f* receive signals from the RF tag 106. The control unit 101 calculates the location of the RF tag 106 based on the triangulation method using the received signal strength of the antennas 103*a*, 103*b*, 103*c*. 103*d*, 103*d*, 103*e*, and 103*f*.

Figure 7:
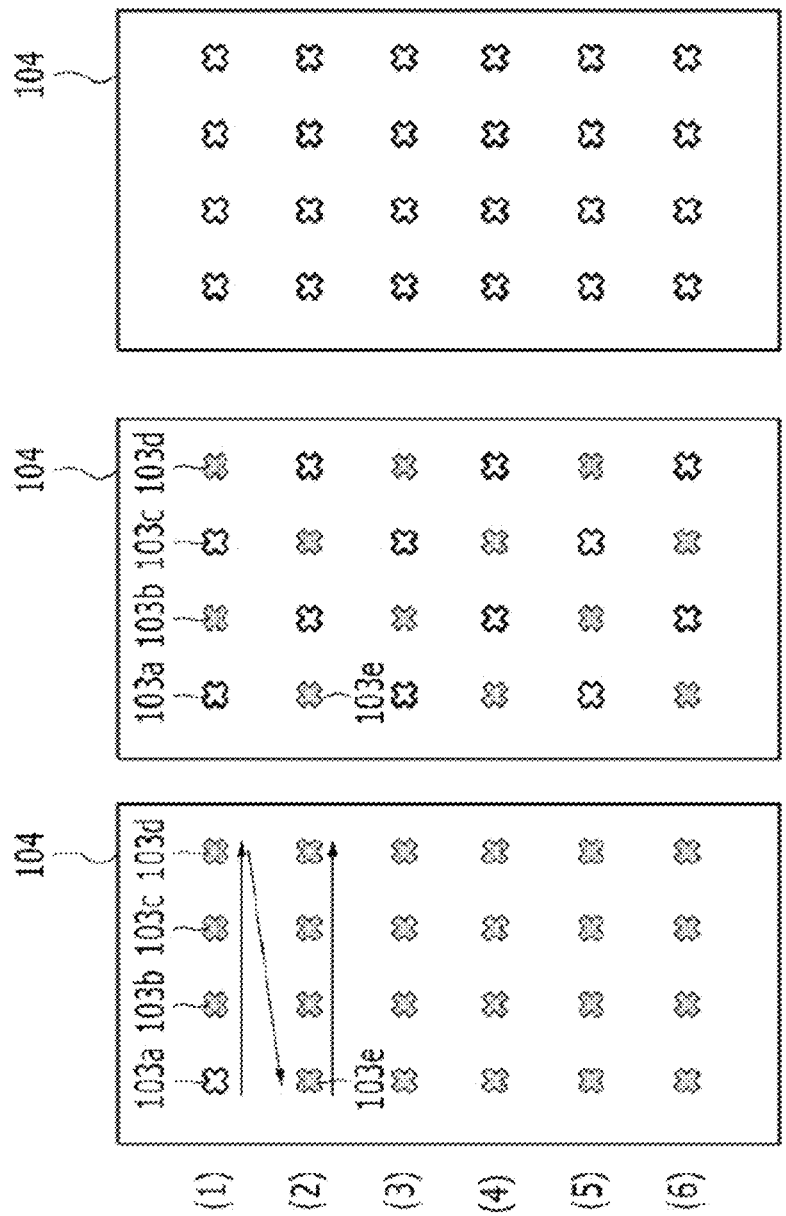
FIGS. 7A-7C show various embodiments in which a power supply unit supplies power to an antenna.

FIGS. 7A-7C show various embodiments in which power supply unit 102 supplies power to the antenna 103. Referring to FIG. 7A, the plurality of antennas 103 are arranged in a plurality of rows and columns. The power supply unit 102 sequentially applies power to the plurality of antennas 103 in ascending order of the rows, and applies power to the plurality of antennas 103 located in the same row in ascending order of the columns. Referring to FIG. 7A, although the speed is slow with sequential search, the possibility of crosstalk is minimized.

Applying power sequentially to the plurality of antennas 103 in ascending order of the rows by the power supply unit 102 means supplying power in the order of rows (1) to (6) in FIG. 7A. Additionally, in the same row, power is supplied in the order of 103*a*, 103*b*, 103*c*, and 103*d*. The power supply unit 102 sequentially supplies power to one antenna 103, and the control unit 101 determines that the RF tag 106 is located near the antenna 103 having the largest received signal strength from the RF tag 106.

Referring to FIG. 7B, the plurality of antennas 103 are arranged in a plurality of rows and columns. The power supply unit 102 supplies power to only one antenna 103 of the two antennas 103 disposed closest to each other. Power is supplied to only one of the two antennas 103a and 103b disposed closest to each other. That is, power is supplied to only one antenna 103 of two arbitrary antennas 103 closest to each other in FIG. 7B. The power supply unit 102 supplies power to only one antenna 103 of two antennas 103 closest to each other, and the control unit 101 determines that the RF tag 106 is located near the antenna 103 having the largest received signal strength from the RF tag 106. It is possible to estimate the location of the RF tag 106 without supplying power to all the antennas 103, thereby reducing power consumption.

Referring to FIG. 7C, the power supply unit 102 supplies power to all the antennas 103 for a predetermined time and cuts off the power. Then, after a predetermined time, the power is supplied again. That is, the power supply unit 102 repeatedly cuts off the power supply to all the antennas 103. The power supply unit 102 sequentially supplies power to one antenna 103, and the control unit 101 determines that the RF tag 106 is located near the antenna 103 having the largest received signal strength from the RF tag 106. Also, the control unit 101 may accurately calculate the location of the tag 106 through the triangulation method. Power consumption may be reduced in that power supply to the antenna 103 is not always performed.

FIGS. 7B and 7C show that the possibility of crosstalk exists although the search speed is fast due to multiple searches.

Figure 8:
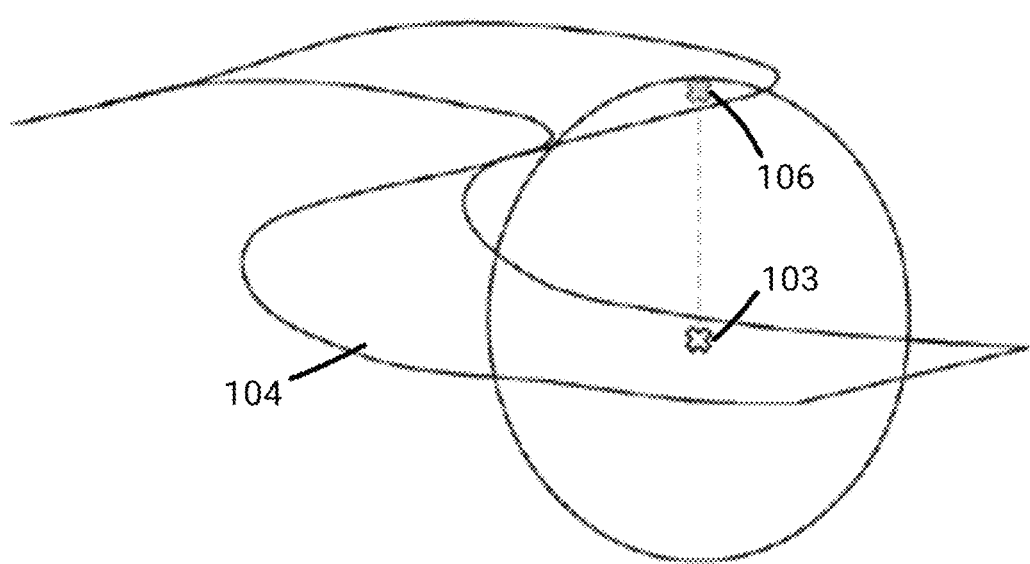
FIG. 8 shows a moved RF tag and an antenna 103 communicating with a tag as a flexible circuit board is bent.

FIG. 8 shows the moved RF tag 106 and the antenna 103 communicating with the tag 106 as the flexible circuit board 104 is bent.

The RF tag 106 is disposed on the flexible circuit board 104, and the control unit 101 determines whether the flexible circuit board 104 is folded based on the received signal strengths received from the plurality of antennas 103 from the RF tag 106.

In this embodiment, not only the antenna 103 but also the RF tag 106 itself may be disposed on the flexible circuit board 104. When the antenna 103, which is spaced a predetermined distance from the RF tag 106 in the plane on the flexible circuit board 104, receives a signal from the tag 106, the control unit 101 determines that the flexible circuit board 104 is folded. Also, the control unit 101 determines how much the flexible circuit board is folded based on the strength of the signal received by the antenna 103 which is spaced a predetermined distance from the RF tag 106.

In a communication device based on a flexible circuit board with wired communication with a tag, the communication device based on the flexible circuit board includes a control unit for controlling the communication device based on the flexible circuit board overall; a power supply unit for supplying power to the communication device based on the control of the control unit based on a control of the control unit; a flexible circuit board; and a plurality of antennas disposed on the flexible circuit board. The power supply unit adjusts the amount of current supplied to each of the plurality of antennas to adjust the detection range of each of the plurality of antennas. The detection range is a range within a longest distance at which an antenna receives a signal from an RF tag, and an RF tag is disposed on the flexible circuit board. The control unit determines whether the flexible circuit board is folded based on a received signal strength received by the plurality of antennas from the RF tag.

When the flexible circuit board is bent, it is possible to recognize the tag located in a specific area and determine the bending degree and location. It is possible to stop the actual electric operation by reading in real time a case where the flexible circuit board is bent or a case where the bent area is shorted.

The bending of a flexible circuit board is determined by a wireless communication method, a sensor, communication disconnection, and communication noise measurement.

The communication system according to the present invention may be implemented in various other applications involving an RF tag and a plurality of antennas disposed or dispersed on a substrate. Herein, the term "substrate" may refer to any substantially planar structure, for example, a board, a panel, a wall, a floor, or the like.

Figure 9A:
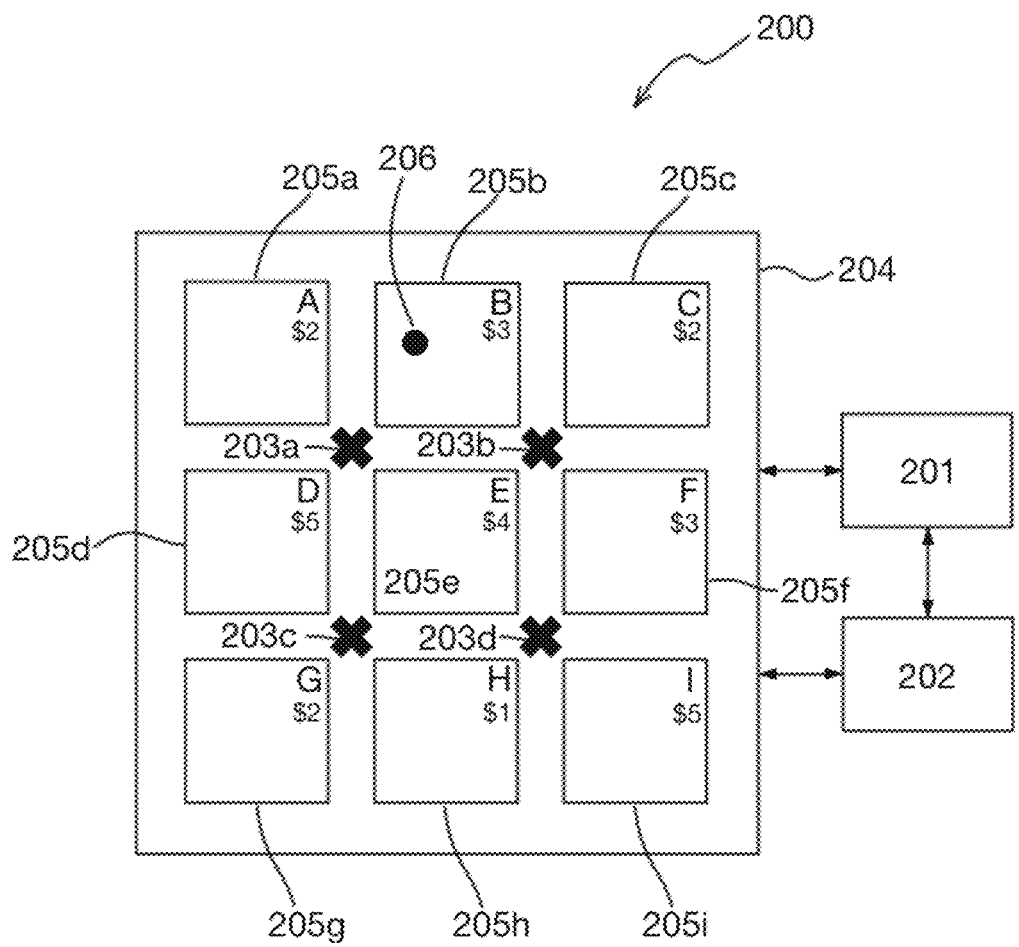
FIG. 9 shows an embodiment where the communication system is implemented in a vending machine system.
Figure 9B:
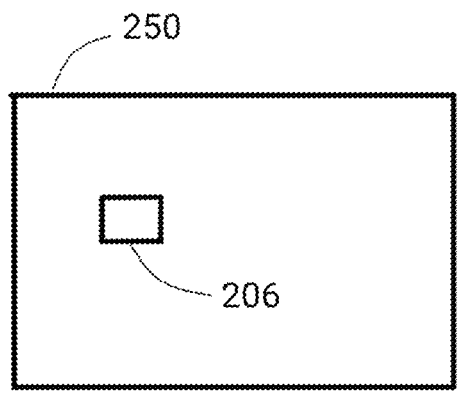

In some embodiments, as shown in FIG. 9, the communication system according to the present invention may be applied to a vending machine system. In such embodiments, the communication system 200 may include a substrate 204; a plurality of antennas 203a, 203b, 203c, and 203d (herein also referred to collectively as 203) disposed on the substrate 204; a power supply unit 202 configured to supply power to the plurality of antennas 203; and a control unit 201 configured to control the power supply unit 202 to apply the power to the plurality of antennas 203 in a predetermined manner. In this embodiment, the substrate 204 of the communication system 200 may be logically divided into a plurality of sections 205a, 205b, 205c, 205d, 205e, 205f, 205g, 205h, and 205i. The number of sections is not limited, and it may be varied depending on particular applications.

When a radio frequency (RF) tag 206 is placed on a particular section of the substrate 204, the control unit 201 may be configured to determine the location of the RF tag 206 with respect to the substrate 204 based on the signals from the RF tag 206 that are received by the plurality of antennas 203. For the determination of the location, the methods described above may be used. The location may be assigned to which section of the substrate 204 the RF tag 206 is placed on.

In the vending machine application, based on the section information determined from the location of the RF tag 206, the control unit 201 may transmit a payment request in an amount that is associated with the determined section. For example, if the RF tag 206 is determined to have been placed on Section 205b, which corresponds to Product B, the control unit 201 may transmit a payment request of $3.00 for Product B.

In such embodiments, the RF tag 206 may be disposed in a portable device 250, and the control unit 201 may transmit the payment request to the portable device 250. In response, the portable device 250 may approve the payment request, and subsequently, the vending machine may dispense a product that is associated with the section where the portable device 250 is placed, which is Product B in the above example. By way of example, the portable device 250 may be implemented as any of a credit card, a debit card, a cash card, a gift card, or a smart phone.

Figure 10:
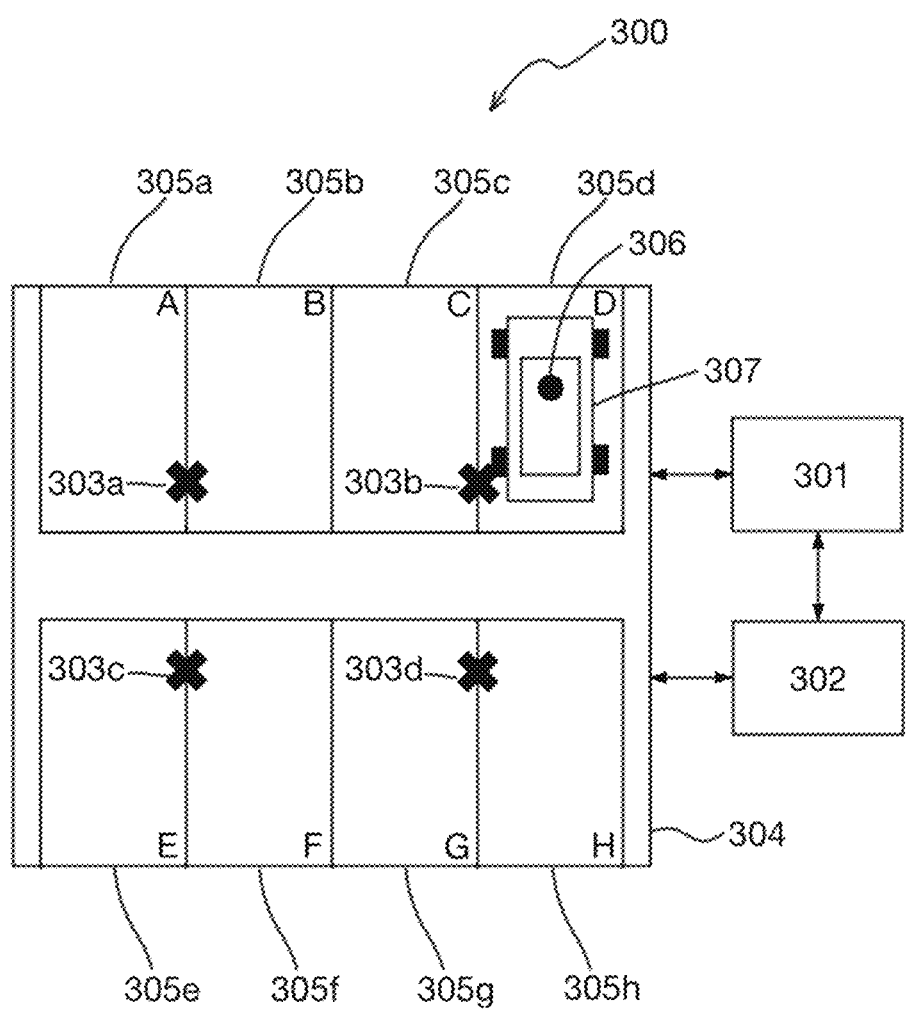
FIG. 10 shows an embodiment where the communication system is implemented in a parking management system.

Referring to FIG. 10, the communication system may be applied to a parking management system. In such embodiment, the communication system 300 may include a substrate 304, which is implemented as a parking lot or garage. The substrate 304 may be sectioned into a plurality of parking spaces 305a, 305b, 305c, 305d, 305e, 305f, 305g, and 305h. A plurality of antennas 303a, 303b, 303c, and 303d (herein, also referred to collectively as 303) may be disposed or dispersed throughout the substrate 304. Similar to the foregoing embodiments, a power supply unit 302 configured to supply power to the plurality of antennas 303 and a control unit 301 configured to control the power supply unit 302 may be provided.

In this embodiment, the RF tag 306 may be disposed in a vehicle 307, and the control unit 301 may be configured to determine the location of the vehicle 307 based on the location of the RF tag 306 with respect to the plurality of antennas 303. The location data may be provided to the owner of the vehicle 307 to assist identifying or finding the parking location of the vehicle 307. In some embodiments, the control unit 301 may be configured to also determine and record the time at which the vehicle 307 is placed at the location. The combination of the time and location data may be used to calculate and charge appropriate parking fees.

In other embodiments, the communication system may be applied to agricultural systems, e.g., a hydroponic horticulture system and/or facility. In such embodiments, the RF tag may be disposed in a hydroponic plant pot. Similar to the embodiments described above, a plurality of antennas may be utilized to determined the location of the RF tag, and thereby the location of the hydroponic plant pots. In particular, the control unit may be configured to store the log data of location changes of the RF tag. The log data of the location changes may be utilized in managing the records of the particular hydroponic plant pot within the horticultural system and/or facility.

A communication device according to the present invention includes a plurality of antennas communicating with an RF tag to precisely calculate the location of the tag.

It is possible to variously activate a plurality of antennas included in a communication device according to the present invention to calculate the location of the RF tag while minimizing power consumption.

It is possible to recognize the bending of a flexible circuit board in a communication device based on a flexible circuit board according to the present invention.

A communication device according to the present invention prevents signal interference caused by the overlapping of detection ranges of a plurality of antennas, thereby eliminating the erroneous recognition.

A communication device according to the present invention may accurately calculate the location of a wireless communicating tag.

The effects of the present invention are not limited to the effects mentioned above, and various effects may be included within the scope of what will be apparent to a person skilled in the art from the following description.

In such a way, those skilled in the art will appreciate that the present invention may be embodied in other specific forms without departing from the spirit or essential characteristics thereof. Therefore, it should be understood that the embodiments described above are merely illustrative, and the scope is not limited. Also, the flowcharts shown in the drawing are merely the sequential steps illustrated by way of example in order to achieve the most desirable results in practicing the present invention, and it is apparent that other additional steps may be provided or some steps may be deleted.

The technical features and implementations executing this described in this specification may be implemented in digital electronic circuits, or may be embodied in computer software, firmware, or hardware, including the structures described herein, and structural equivalents thereof, or may be embodied in a combination of one or more of these. Also, implementations executing the technical features described in this specification may be implemented as modules relating to computer program instructions encoded on a type of program storage medium in order to control a computer program product, that is, an operation of a processing system or its execution.

In such a way, this specification is not intended to limit the present invention by the disclosed specific term. Therefore, while the present invention has been particularly shown and described with reference to exemplary embodiments thereof, those of ordinary skill in the art will made modifications, changes, and variations to the embodiments without departing from the scope of the present invention.

The scope of the present invention is defined by the appended claims rather than the above detailed description, and all changes or modifications derived from the meaning and range of the appended claims and equivalents thereof are to be interpreted as being included within the scope of present invention.

What is claimed is:

1. A communication system comprising:
   a substrate;
   a plurality of antennas disposed on the substrate;
   a power supply unit configured to supply power to the plurality of antennas; and
   a control unit configured to control the power supply unit to apply the power to the plurality of antennas in a predetermined manner,
   wherein the substrate is divided into a plurality of sections corresponding to different products,
   wherein the control unit is further configured to:
      in response to an RF tag being placed near the substrate, determine a location of the RF tag with respect to the substrate based on a signal from the RF tag received by the plurality of antennas to identify a section among the plurality of sections of the substrate at which the RF tag is placed;
      determine a payment amount associated with a product that corresponds to the section at which the RF tag is placed;
      transmit a payment request in the determined payment amount, and
      dispense the product that corresponds to the section at which the RF tag is placed.

2. The communication system of claim 1, wherein the RF tag is disposed in a portable device.

3. The communication system of claim 2, wherein the portable device is implemented as any of a credit card, a debit card, a cash card, a gift card, or a smart phone.

4. The communication system of claim 1, wherein the plurality of antennas are printed on a printed circuit board (PCB).

5. The communication system of claim 1, wherein the predetermined manner of controlling the power supply unit includes a scanning manner, an alternating manner, an intermittent manner, or any combination thereof,
   wherein in the scanning manner, the power is supplied sequentially to one antenna after another antenna,
   wherein in the alternating manner, the power is supplied to only one antenna among two antennas that are adjacent to each other, and
   wherein in the intermittent manner, the power is supplied to all of the plurality of antennas with a predetermined interval.

6. The communication system of claim 1, wherein when three or more antennas among the plurality of antennas receive signals from the RF tag, the control unit is configured to determine the location of the RF tag based on triangulation method using strengths of the signal received from the RF tag.

7. The communication system of claim 1, wherein the location of the RF tag is determined based on which antenna among the plurality of antennas receives a strongest signal from the RF tag.

8. The communication system of claim 1, wherein the power supply unit adjusts an amount of current supplied to each of the plurality of antennas to prevent a detection range of a first antenna among the plurality of antennas from overlapping a detection range of a second antenna among the plurality of antennas.

9. The communication system of claim 1, wherein the power supply unit adjusts an amount of current supplied to each of the plurality of antennas to cause a detection range of a first antenna among the plurality of antennas to overlap a detection range of a second antenna among the plurality of antennas that is adjacent to the first antenna.

10. The communication system of claim 1, wherein the power supply unit adjusts an amount of current supplied to each of the plurality of antennas to cause a detection range of a first antenna among the plurality of antennas to overlap a detection range of a second antenna among the plurality of antennas that is two antennas apart from the first antenna.

11. The communication system of claim 1, wherein the plurality of antennas are arranged in rows and columns, and
wherein the power supply unit sequentially applies power to the plurality of antennas in ascending order of the rows, and applies power to antennas of a same row in ascending order of the columns.

12. The communication system of claim 1, wherein the plurality of antennas are arranged in rows and columns, and
wherein the power supply unit supplies power to only one antenna among two antennas disposed adjacent to each other.

13. The communication system of claim 1, wherein the power is intermittently supplied to all of the plurality of antennas with a predetermined interval.

* * * * *